United States Patent [19]

Strack

[11] Patent Number: 5,396,088
[45] Date of Patent: Mar. 7, 1995

[54] MOS COMPONENT WITH A PARTICULAR SOURCE AND BASE STRUCTURE

[75] Inventor: Helmut Strack, Munich, Germany

[73] Assignee: Siemens Aktiengesellschaft, Munich, Germany

[21] Appl. No.: 240,138

[22] Filed: May 10, 1994

[30] Foreign Application Priority Data

May 11, 1993 [DE] Germany .................. 4315723.8

[51] Int. Cl.$^6$ .................. H01L 29/78; H01L 29/784
[52] U.S. Cl. .................. 257/139; 257/329; 257/140
[58] Field of Search .............. 257/139, 140, 141, 142, 257/143, 144, 146, 328, 329

[56] References Cited

U.S. PATENT DOCUMENTS 5,034,785 7/1991 Blanchard .................. 257/330

FOREIGN PATENT DOCUMENTS 2-54968 2/1990 Japan .................. 257/139

OTHER PUBLICATIONS

"Latch-Back-Free Self-Aligned Power MOSFET Structure with Silicided Source and Body Contact," Koh et al IEEE Electron Device Letters, vol. 9, No. 8, Aug. 1988 (pp. 408–410).

Primary Examiner—Rolf Hille
Assistant Examiner—Wael M. Fahmy
Attorney, Agent, or Firm—Hill, Steadman & Simpson

[57] ABSTRACT

The source zone of an MOS component on a semiconductor body is disposed on the upper side of the gate electrode, and is in contact at an upper side of the source zone, with a source electrode. The base zone laterally adjoins the source zone and laterally adjoins the gate electrode at the drain zone. The minority charge carriers which flow from the semiconductor body to the cathode therefore flow directly to the source electrode through that part of the base zone disposed next to the gate electrode. An activation of a parasitic bipolar transistor, and thus the occurrence of so-called second breakdown, are thus avoided.

4 Claims, 1 Drawing Sheet

MOS COMPONENT WITH A PARTICULAR SOURCE AND BASE STRUCTURE

BACKGROUND OF THE INVENTION

1. Field of the Invention

The present invention is directed to a metal-oxide-semiconductor (MOS) component.

2. Description of the Prior Art

MOS components are known in the art having the general arrangement of at least one drain zone, at least one base zone, and at least one source zone arranged in the base zone. At least one gate electrode in such known structures is arranged over the drain zone, and is electrically insulated from the source zone and from the drain zone. A source electrode at least partially covers the source-side surface of the semiconductor body, the source electrode being conductively connected to the source zone and to the base zone, and being electrically insulated from the gate electrode. Such MOS components form, for example a MOSFET.

MOSFETs have a unipolar conduction mechanism which carries the current to a prescribed limit of the field strength. When the voltage in the semiconductor body increases, charge carrier pairs arise and the minority charge carriers are extracted to the source electrode by the electrical field. The minority charge carriers flow partially laterally along the source zone. When the voltage at the pn-junction between the source zone and the base zone increases to approximately 0.5 volts, the source zone begins to emit electrons. This results in an increase in the current density, and may possibly result in the activation of a parasitic bipolar transistor, composed of the source zone, the base zone and the drain zone. The current density in the drain zone is caused to suddenly increase upon the activation of such a parasitic bipolar transistor, and the MOSFET is destroyed by so-called second breakdown. The destruction mechanism is similar in an IGBT; the application of current to the anode-side bipolar transistor produces additional holes which can result in a latch-up of the parasitic thyristor.

SUMMARY OF THE INVENTION

It is an object of the present invention to provide an MOS component of the type generally described above wherein the activation of a parasitic bipolar structure is reliably prevented.

The above object is achieved in accordance with the principles of the present invention in an MOS component on a semiconductor body wherein the source zone is arranged on the gate electrode, the source zone is electrically connected to a source electrode at a side of the source electrode facing away from the gate electrode, the base zone laterally adjoins the source zone, and the base zone also laterally adjoins the drain zone next to the gate electrode. This structure avoids the activation of a parasitic bipolar structure, and thus avoids the destruction of the component due to "second breakdown."

DESCRIPTION OF THE PREFERRED EMBODIMENTS

Figure 2:
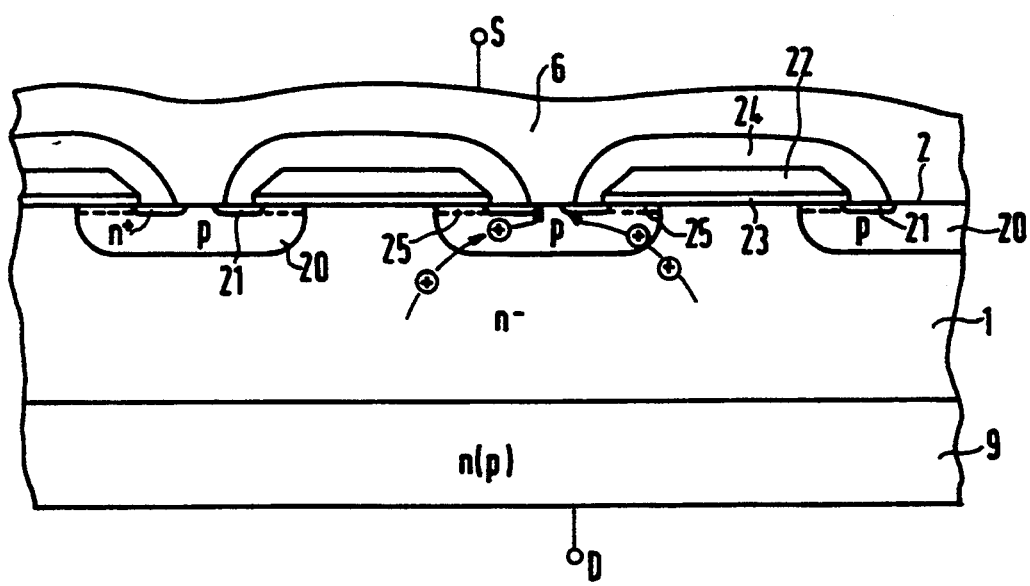
FIG. 2 sectional view of an MOS component of the type known in the prior art.

A MOSFET of the type known in the prior art is shown in FIG. 2, and has a semiconductor body with a lightly n-doped drain zone 1. The drain zone 1 extends to the source-side surface 2 of the semiconductor body. Base zones 20, which are p-doped, are embedded into the drain zone 1 at the side of the surface 2. Highly n-doped source zones 21 are embedded into the base zones 20. The drain zone 1 is covered by gate electrodes 22 at the surface 2, these gate electrodes 22 being insulated from the surface 2 by an insulating layer 23. The gate electrodes 22 also overlap the base zones and extend up to the source zones 21. When a positive voltage is applied to the gate electrode 22, an n-conductive channel 25 arises in the base zones 20, which connects the source zones 21 to the drain zone 1. Both the source zones 21 and the base zones 20 are electrically contacted by a source electrode 6 at the source side. The source electrode 6 is connected to a source terminal S. A more highly n-doped zone 9 adjoins the drain zone 1 at the other side of the semiconductor body. This n-doped zone 9 is connected to a drain terminal D. In an IGBT, the zone 3 is p-doped.

In the known device of FIG. 2, when a voltage is applied to the terminals S and D, electrons flow from the source zones 21 to the drain zone 1 given a positive gate voltage. With increasing field strength, charge carrier pairs arise. The arising minority charge carriers are extracted to the source electrode 6 by the electrical field. When the hole current flowing beneath the source zones in the transfer direction generates a voltage of approximately 0.5 volts at the pn-junction between the source zone 21 and the base zone 20, the source zone 21 is undesirably caused to emit electrons, and a bipolar transistor composed of the source zones 21, the base zones 20 and the drain zone 1 becomes activated in a conducting state. This can destroy the known component shown in FIG. 2 by virtue of the so-called "second breakdown."

Figure 1:
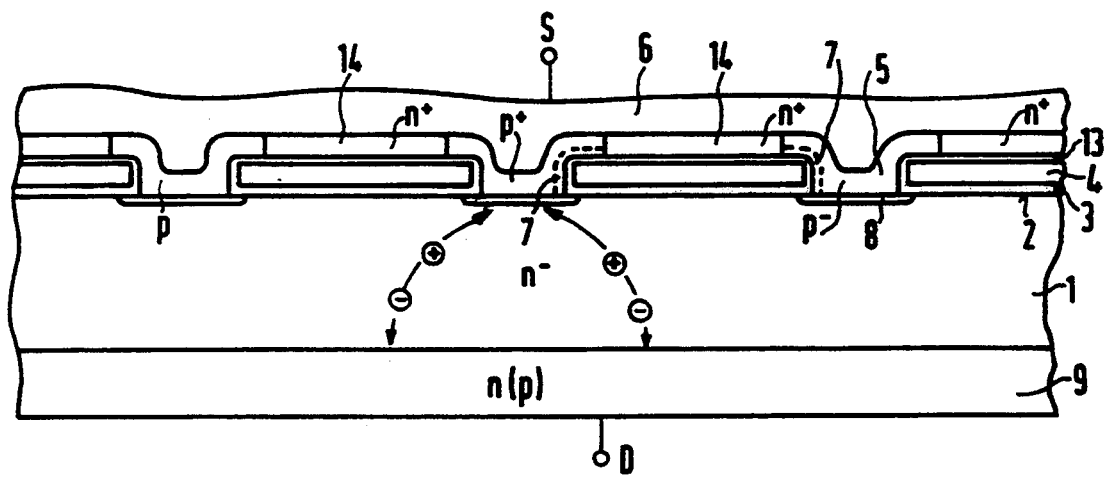
FIG. 1 is aside sectional view of an exemplary embodiment of an MOS component constructed accordance with the principles of the present invention.

This problem is avoided in the MOSFET shown in FIG. 1 constructed in accordance with the principles of the present invention. The MOSFET of FIG. 1 again has a lightly n-doped drain zone 1 with a source-side surface 2. A structured insulating layer 3 is arranged on the surface 2. A gate electrode 4 is disposed on the insulating layer 3. The gate electrode 4 is covered laterally and at its upper side by a further insulating layer 13. Insulated by the insulating layer 13, a source zone 14 is disposed on the upper side of the gate electrode 4. A lightly p-doped base zone 5 laterally abuts the source zone 14. The base zone 5 overlaps the gate electrode 4 and abuts the drain zone 11 next to the gate electrode 4. Alternatively, the source zone 14 may extend to the edge of the gate electrode 4 and abut the base zone 5 at that location. In this case, the base zone 5 would not overlap the gate electrode 4.

At its side facing away from the gate electrode 4, the source zone 14 is electrically contacted by a source electrode 6. The base zone 5 is similarly electrically connected to the source electrode 6. In practice, a p-doped region 8 diffuses out of the base zone 5 into the drain zone 1.

When a drain-source voltage is applied to the exemplary embodiment of the invention shown in FIG. 1, and the gate electrode 4 is positively biased, electrons flow from the source zone 14 through a channel 7 in the base zone 5 and the diffused region 8 along the surface of the insulating layers 3 and 13 enveloping the gate electrode 4. The current flows into the drain zone 1.

A hole current begins to flow to the surface 2 starting when a certain field strength is reached. In the inventive structure shown in FIG. 1, however, the holes flow directly to the source electrode 6 through the base zone 5, without taking a path along the source zone 14, as in the prior art structure exemplified in FIG. 2. An emission of electrons from the source zone 15 is therefore suppressed in the structure of FIG. 1, and a parasitic bipolar transistor therefore does not arise. The potential damage caused by such a parasitic bipolar transistor is thus avoided.

In the exemplary embodiment of FIG. 1, respective surfaces of the drain zone, the gate electrode 4 and the source zone 14 are substantially planar and flat. The principle disclosed herein, however, can also be employed with benefit in structures which do not have such a planar arrangement, such as in trench MOS, U-MOS or V-MOS transistors.

The inventive arrangement disclosed herein can also be used to benefit in an IGBT, which is based on a bipolar conduction mechanism. In an IGBT, the holes arising from the p-doped zone 9 are extracted by the source electrode 6, so that the bipolar transistor at the cathode side cannot become conducting. The current amplification of the IGBT thus remains less than one under all operating conditions, so that the activation of a parasitic thyristor, and the resulting latch-up of the IGBT, are prevented.

Although modifications and changes may be suggested by those skilled in the art, it is the intention of the inventor to embody within the patent warranted hereon all changes and modifications as reasonably and properly come within the scope of his contribution to the art.

I claim as my invention:

1. An MOS component on a horizontally oriented semiconductor body, comprising:
    at least one drain zone in said horizontally oriented semiconductor body, at least one base zone on said horizontally oriented semiconductor body and at least one source zone;
    at least one gate electrode disposed, over said drain zone and electrically insulated from said source zone and said drain zone, said source zone being vertically stacked on and over said gate electrode;
    a portion of said base zone extending to laterally adjoin said source zone next to said gate electrode and being electrically insulated from said gate electrode; and
    a source electrode electrically contacted with said source zone on a surface facing away from said gate electrode.

2. An MOS component as claimed in claim 1 wherein each of said drain zone and said gate electrode have respective planar surfaces, and wherein said planar surface of said base zone overlaps said planar surface of said gate electrode.

3. An MOS component as claimed in claim 1 wherein a zone of the same conductivity type as said drain zone, and which is more highly doped than said drain zone, is disposed adjoining said drain zone at a side of said drain zone opposite said source zone and said base zone.

4. An MOS component as claimed in claim 1 further comprising a zone having a conductivity type opposite the conductivity type of the drain zone is disposed adjoining said drain zone at an anode side.

* * * * *